United States Patent [19]

Dickson et al.

[11] Patent Number: 5,760,473
[45] Date of Patent: Jun. 2, 1998

[54] SEMICONDUCTOR PACKAGE HAVING A EUTECTIC BONDING LAYER

[75] Inventors: Joseph F. Dickson, Cazenovia, N.Y.; Lee Benat Max, San Jose, Calif.

[73] Assignee: Brush Wellman Inc., Cleveland, Ohio

[21] Appl. No.: 670,810

[22] Filed: Jun. 25, 1996

[51] Int. Cl.$^6$ .................... H01L 23/02; H01L 39/02; H01L 23/48; H01L 23/12

[52] U.S. Cl. .................. 257/728; 257/693; 257/707; 257/276; 257/717; 257/712; 257/676

[58] Field of Search .......................... 257/693, 712, 257/714, 728, 276, 676, 707, 706, 717

[56] References Cited

U.S. PATENT DOCUMENTS

| | | | |
|---|---|---|---|
| 3,994,430 | 11/1976 | Cusano et al. | 257/782 |
| 3,996,603 | 12/1976 | Smith | 257/728 |
| 4,172,261 | 10/1979 | Tsuzuki et al. | 257/706 |
| 4,242,598 | 12/1980 | Johnson et al. | 257/712 |
| 4,408,218 | 10/1983 | Grabbe | 257/610 |
| 4,639,760 | 1/1987 | Granberg et al. | 257/724 |
| 4,649,416 | 3/1987 | Borkewski et al. | 257/728 |
| 4,809,135 | 2/1989 | Yerman | 257/676 |
| 4,902,854 | 2/1990 | Kaufman | 257/473 |
| 5,075,759 | 12/1991 | Moline | 257/728 |
| 5,371,405 | 12/1994 | Kagawa | 257/725 |
| 5,490,647 | 2/1996 | Krum et al. | 248/118.1 |
| 5,525,753 | 6/1996 | Mennucci et al. | 361/707 |
| 5,583,317 | 12/1996 | Mennucci et al. | 174/163 |

OTHER PUBLICATIONS

Tummala, R.R. and Rymaszewski, E.J., "Microelectronics Packaging Handbook," Van Nostrand, New York, 1989.

Motorola RF Device Data DL 110/D, Rev. 5, (1996) pp. 2–273, 2–276, and 4–29, no month.

Brush Wellman Drawing No. RF024, Rev. D, 27 Mar. 1996.

Brush Wellman Drawing No. RF083, Rev. B, 6 Jun. 1996.

Ericsson RF Power Transistors Data Book, pp. 15, 17, 143, 149, no date.

Ericsson Preliminary PTF 10004 LDMOS FET Transistor, Draft Rev. Sep. 23, 1996, pp. 1–4.

BioPolarics Inc., BiPolarics Microwave Transistors from Small Signal to High Power, BA Series Silicon MMIC Amplifiers, 1 page, no date.

Kashiba et al., Ceramic Substrates with Molybdenum–Cooper Layered Foil Conductors for Power Hybrids, ISHM '94 Proceedings, pp. 427–431, no date.

*Primary Examiner*—Tom Thomas
*Assistant Examiner*—Alexander Oscar Williams
*Attorney, Agent, or Firm*—Calfee, Halter & Griswold LLP

[57] ABSTRACT

A package for a backside-ground high power transistor comprises a metal base, a flat insulator layer on the base defining a window for receiving the transistor and a pair of flat metal layer bonded to the upper surface of the insulator layer, the flat metal layers serving as electrical leads for connection to the collector and drain of the transistor received therein. A method for bonding a ceramic to a metal is also provided by the present invention. The method comprises the steps of contacting eutectic-forming layers on a common shim structure with ceramics and metals, heating the eutectic-forming layers to a temperature that is greater than the melting temperature of the eutectic-forming layers, and allowing the eutectic-forming layers to solidify, thereby bonding the ceramic to the metal.

18 Claims, 3 Drawing Sheets

SEMICONDUCTOR PACKAGE HAVING A EUTECTIC BONDING LAYER

BACKGROUND OF THE INVENTION

The present invention relates to a novel package for backside ground high power transistors.

Many RF/microwave applications require high power transistors, i.e. transistors having a power output of 20 watts or more. These high power transistors are typically housed in packages which include a mounting flange for mounting the package on a support, such as a metal heat sink, as well as an intermediate ceramic layer for bonding the transistor to the flange in an electrically insulating manner. Since power transistors of this type produce large amounts of Jewell heat, the flange, insulating ceramic and semiconductor must have an acceptable match of coefficients of thermal expansion to prevent delamination from thermal stresses encountered in normal operation.

Recently, a new type of high power transistor has been developed for use in RF/microwave applications. In this transistor, the ground of the transistor is located in the lower major surface or "backside" of the transistor, opposite the upper major surface or "top" where the collector and emitter are located. A transistor of this type is intended to be directly connected, electrically, to the base on which it is supported. However, at the present time, packaging assemblies ideally suited for housing such backside ground high power transistors have not been developed.

Accordingly, there is a need for a new design of a package ideally suited for housing high power, backside- ground transistors.

SUMMARY OF THE INVENTION

In accordance with the present invention, a package ideally suited for use in housing high power, backside-ground transistors is composed of an electrically conductive base, an insulator layer bonded to the base and two package electrical leads bonded to the insulator layer. The insulator layer defines a window therein for receiving the transistor, while the two package electrical leads are bonded to the upper surface of the insulator layer, preferably adjacent the top of the transistor received in the window. If desired, a cap can be placed on top of the insulator layer so that the transistor is completely enclosed by the base, insulator layer and cap.

The inventive package can be easily made by bonding the base and the two package electrical leads to the insulator layer by brazing, direct copper bonding or the like. It is therefore simple and inexpensive to manufacture. Also, the inventive package can be made substantial enough so that the entire electronic assembly, including the transistor, can be attached to a substrate such as heat sink by a clamp or other compression means. Therefore, the need to use screws or analogous fastening systems to attach the assembly to a substrate is eliminated.

In a preferred aspect of the invention, it has been found that the bond strength between certain metals and ceramics when bonded together by the direct copper bonding process can be markedly enhanced by inserting a desirably oxidized shim copper shim between the metal and ceramic before they are bonded together. Thus, the present invention, in this aspect, enables the inventive transistor package, as well as other devices formed with a metal/ceramic bond, to be fabricated by direct copper bonding using a much wider variety of metal/ceramic combinations than previously possible.

BRIEF DESCRIPTION OF THE DRAWINGS

The present invention may be more readily understood by reference to the drawings wherein.

DETAILED DESCRIPTION

Figure 1:
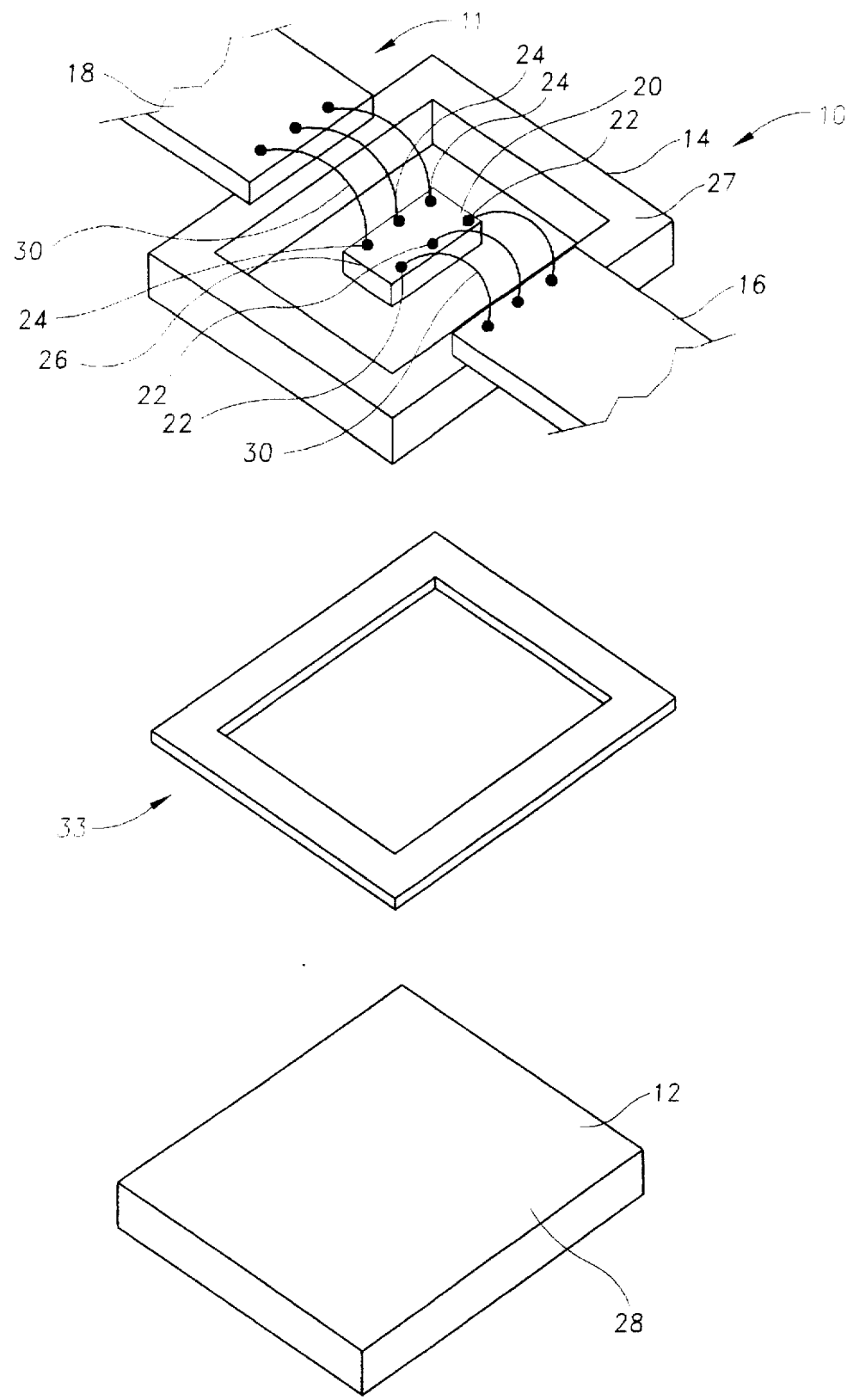
FIG. 1 is an exploded schematic view of an electronic assembly comprising a high power, backside-ground transistor received in the transistor package of the present invention.

Referring to FIG. 1, an electronic assembly in accordance with the present invention is generally indicated at 10. Electronic assembly 10 is composed of a high power transistor 20 and a transistor package, generally indicated at 11. Transistor package 11 is composed of a base 12, an insulator layer 14 and package electrical leads 16 and 18 for electrical connection to the collector or gate and the drain of high power transistor 20. In the embodiment illustrated, base 12 is formed from a copper/tungsten composite, insulator layer 14 is formed from alumina, and package electrical leads 16 and 18 are formed from copper.

High power transistor 20 is an RF/microwave power die or chip having a power rating of 5 watts or more. It has three collector or gate contacts 22 and three drain contacts 24 defined in its upper major surface 26. On its opposite or lower major surface, power transistor 24 defines a ground electrical contact which is in direct electrical contact with substantially flat upper major surface 28 of base 12 of transistor package 11.

In the embodiment shown, insulator layer 14 is substantially flat and defines a lower major surface which is bonded to the upper or first major surface 28 of the base 12. Bonding of insulator layer 14 to base 12 can be accomplished by any means known in the art such as brazing and the like. Preferably, bonding is accomplished by direct copper bonding.

In direct copper bonding of desirably oxidized shim 33, a copper-containing composite is heated to defuse copper to the surface, the copper on the surface is subjected to oxidation, and the ceramic to be bonded thereto is placed on the oxidized copper surface. The assembly so formed is then heated to form a copper-oxide eutectic at the copper/ceramic interface, the eutectic forming a secure bond between the substrate and the ceramic upon cooling. This technique is fully described in U.S. Pat. No. 5,490,627, the disclosure of which is incorporated herein by reference.

Referring again to FIG. 1, package electrical leads 16 and 18 take the form of substantially flat layers of copper metal, which are bonded to the upper major surface 27 of insulator layer 14. This bonding can be accomplished in the same manner as described above in connection with bonding insulator layer 14 to base 12.

In order to electrically connect the collector contacts 22 and the drain contacts 24 on power transistor 20 to package electrical leads 16 and 18, six transistor leads 30, which in the embodiment shown comprise gold or aluminum wires, are provided. As shown in FIG. 1, three of these transistor leads 30 connect collector contacts 22 with the leading end of package electrical lead 16 located adjacent power transistor 20, while the other three transistor leads 30 connect drain contacts 24 with package electrical lead 18 at its leading end adjacent power transistor 20. This wire bonding of the chip to the package leads is the conventional method of chip to package interconnection.

Figure 2:
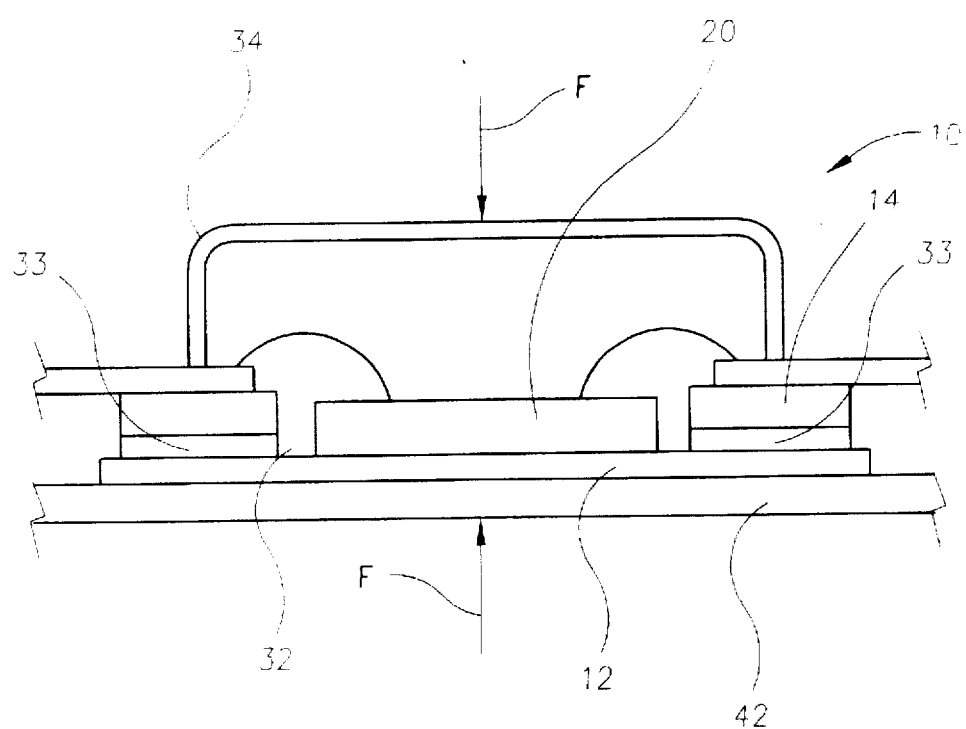
FIG. 2 is an elevational view of the transistor package of FIG. 1 when in an assembled condition and further provided with a cap.

FIG. 2 illustrates the electronic assembly of FIG. 1 in an assembled condition. As can be seen from this figure, base 12 together with insulator layer 14 define a cavity 32 therein which receives power transistor 20 therein. If desired, a cap 34 can be provided, cap 34 together with base 12 and insulator layer 14 completely enclosing power transistor 20 therein.

Figure 3:
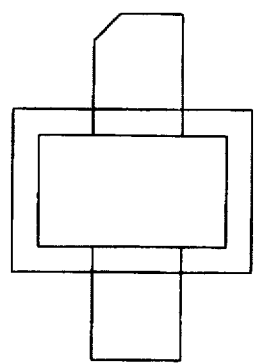
FIG. 3 is a plan view of another electronic assembly made in accordance with the principles of the present invention.
Figure 4:
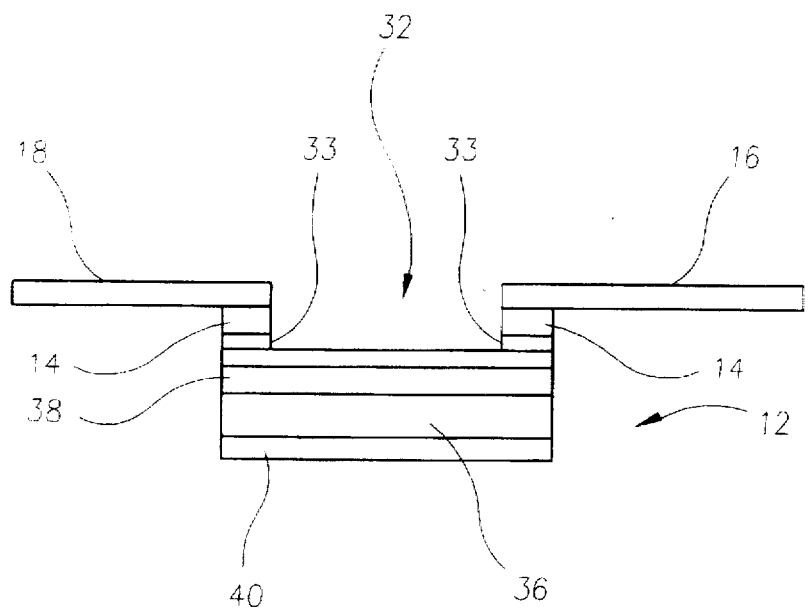
FIG. 4 is an elevational view of the transistor package of FIG. 3 when mounted on a substrate such as a heat sink.

FIGS. 3 and 4 illustrate another transistor package produced in accordance with the present invention. The transistor package of FIGS. 3 and 4 is similar to the transistor package of FIGS. 1 and 2 except that base 12 of this package is composed of a layer of molybdenum 36 clad on both sides with copper layers 38 and 40. In addition, the leading ends of package electrical leads 16 and 18, i.e. the edges facing cavity 32 are coterminous with the inside faces of insulator layer 14 defining cavity 32 rather than being spaced slightly away from these faces as in the case of the package of FIGS. 1 and 2.

The transistor package of the present invention can be made from a wide variety of different materials and combinations of materials. For example, in addition to alumina insulator layer 14 can be made from other electrically-insulating, heat-resistant materials such as beryllia, aluminum nitride, mullite, sapphire and diamond. Alumina, however, is preferred.

Similarly, package electrical leads 16 and 18 can be made from a wide variety of different materials, in addition to copper, such as beryllium, tungsten copper, silver copper, Kovar (54% iron, 29% nickel, 16% cobalt), nickel and Alloy 42 (42% nickel, 58% iron). Copper is preferred.

In the same way, base 12 can be made from a wide variety of materials other than the copper/tungsten composite and copper clad molybdenum materials illustrated in FIGS. 1 to 4. Examples are tungsten copper, copper, E-material (25 to 74% BeO, balance beryllium metal), molybdenum, tungsten, copper graphite, copper clad Invar™ (Invar is 50% nickel, 50% iron), Cuvar™ (43% copper, 57% Invar), Kovar, Alloy 42, and silicon carbide. Preferred materials are copper clad molybdenum, copper clad tungsten, copper molybdenum composites, cooper tungsten composites, molybdenum and E-Material™.

It will therefore be appreciated that a wide variety of choices is available in designing transistor packages of the present invention for particular applications paying due regard to anticipated conditions of heat load, temperature variations and environment.

The resultant package is rugged in construction and therefore can be used in a wide variety of different applications. In this connection, a particularly desirable feature of the inventive transistor package and electronic assembly made therefrom is that it can be easily connected to a substrate such as a heat sink by a simple compressive device. This is illustrated in FIG. 2 which shows the electronic assembly 10 of the present invention being mounted on a heat sink 42 of a piece of electronic equipment by means of a clamp (not shown) exerting a compressive force acting in the directions of arrows F in FIG. 2. Mounting of the electronic package in this manner eliminates the screws or other fastening means used in prior art technology and hence is very attractive from a cost reduction standpoint.

In accordance with another aspect of the present invention, it has been found that the general direct copper bonding process as described in U.S. Pat. No. 5,490,627, can be employed to bond insulator layer 14 to both base 12 and package electrical leads 16 and 18 even though these latter components may not be formed from copper or a copper-containing material. In particular, it has been found that the direct copper bonding process can be used to directly bond together a much wider variety of metal/ceramic combinations than previously thought possible. In accordance with this aspect of the invention, copper-containing and even copper-free metals are securely bonded to various ceramics using the direct copper bonding process by placing a thin (e.g. 0.001 to 0.012 inch thick) layer of copper metal between the metal and ceramic layers to be bonded prior to carrying out the oxidation step for converting copper metal to copper oxide. For example, base 12 of the inventive transistor package when made from various copper-free metals such as tungsten, molybdenum and the like can be directly bonded to alumina insulator layer 14 by direct copper bonding if a layer of copper metal somewhere in the range of 0.003 inch thick is placed on the metal substrate before it is subjected to the oxidation step of the direct copper bonding process of U.S. Pat. No. 5,490,627. Also, the copper may be desirably pre-oxidized. This enables the inventive transistor package to be easily fabricated by the direct bond copper process, even though it is constructed from a wide variety of different materials including metal and metal composites not containing copper.

From the foregoing, it can be seen that the present invention provides a new design for a backside ground high powered transistor package which is simple in design, easy to construct and can be made from a wide variety of different materials. In addition, the completed electronic assembly, made from this package and a backside ground high power transistor is simpler in design, and easier to mount, than most prior art systems.

Although only a few embodiments of the present invention have been described, it should be appreciated that many modifications can be made without departing from the spirit and scope of the invention. All such modifications are intended to be included within the scope of the present invention, which is to be limited only by the following claims:

We claim:

1. A package for containing a backside-ground high power transistor, said package comprising
   (a) an electrically-conductive base for bonding to the backside of said transistor,
   (b) an insulator layer bonded to said base, said insulator layer defining a window therein for receiving said transistor,
   (c) a eutectic layer disposed between said insulator layer and said base for bonding insulator layer to said base, and
   (d) at least two package electrical leads for electrical connection to said transistor, said package electrical leads being bonded to said insulator layer.

2. The package of claim 1, wherein said base defines a first major surface, wherein said insulator layer defines an upper major surface and a lower major surface bonded to the first major surface of said base, and wherein said package electrical leads are bonded to the upper major surface of said insulator layer.

3. The package of claim 2, wherein said insulator layer and each of said package electrical leads is substantially flat.

4. The package of claim 1 further comprising a cap, said cap together with said base and said insulating layer defining a space in said package for enclosing said transistor therein.

5. The package of claim 1, wherein said insulator layer is independently bonded to each of said package electrical leads and said base by direct copper bonding or by brazing.

6. The package of claim 1, wherein said base is made from copper-clad molybdenum, copper-clad tungsten, copper tungsten composite, copper molybdenum composite, copper, E-Material™, molybdenum, tungsten, copper graphite, copper clad Invar™, Cuvar™, Kovar, Alloy 42, and silicon carbide.

7. The package of claim 6, wherein said insulator layer is made from alumina, beryllia, aluminum nitride, mullite, sapphire and diamond.

8. The package of claim 7, wherein said package electrical leads are made from copper, beryllium copper, Kovar, nickel and Alloy 42.

9. The package of claim 8, wherein said insulator layer is made from alumina, and further wherein said package electrical leads are made from copper.

10. An electronic assembly comprising:
   a backside-ground high power transistor,
   a package for said transistor, said package comprising
   (a) an electrically-conductive base, the backside of said transistor being bonded to said base,
   (b) an insulator layer bonded to said base, said insulator layer defining a window therein receiving said transistor,
   (c) a eutectic layer disposed between said insulator layer and said base for bonding said insulator layer to said base, and
   (d) at least two package electrical leads for electrical connection to said transistor, said package electrical leads being bonded to said insulator layer.

11. The assembly of claim 10, wherein said base defines a first major surface, wherein said insulator layer defines an upper major surface and a lower major surface bonded to the first major surface of said base, and wherein said package electrical leads are bonded to the upper major surface of said insulator layer.

12. The assembly of claim 11, wherein said insulator layer and each of said package electrical leads is substantially flat.

13. The assembly of claim 12 further comprising a cap, said cap together with said base and said insulating layer defining a space in said package for enclosing said transistor therein.

14. The assembly of claim 13, wherein said insulating layer is independently bonded to each of said package electrical leads and said base by direct copper bonding or by brazing.

15. The assembly of claim 14, wherein said base is made from copper-clad molybdenum, copper-clad tungsten, copper tungsten composite, copper molybdenum composite, copper, molybdenum, tungsten, copper graphite, copper clad Invar, Cuvar, Kovar, Alloy 42, and silicon carbide.

16. The assembly of claim 15, wherein said insulator layer is made from alumina, beryllia, aluminum nitride, mullite, sapphire and diamond.

17. The assembly of claim 16, wherein said package electrical leads are made from copper, beryllium copper, Kovar, nickel and Alloy 42.

18. The assembly of claim 17, wherein said insulator layer is made from alumina, and said package electrical leads are made from copper.

* * * * *

UNITED STATES PATENT AND TRADEMARK OFFICE
CERTIFICATE OF CORRECTION

PATENT NO. : 5,760,473
DATED : June 2, 1998
INVENTOR(S) : Joseph F. Dickson, Lee Benat Max, and Jeffrey A. Karker It is certified that error appears in the above-indentified patent and that said Letters Patent is hereby corrected as shown below:

ON THE TITLE PAGE:

Item [54] -- Jeffrey A. Karker, Cazanovia, N.Y. --

Signed and Sealed this

Twenty-ninth Day of September, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,760,473
DATED : June 2, 1998
INVENTOR(S) : Joseph F. Dickson, Lee Benet Max, Jeffrey A. Karker It is certified that error appears in the above-indentified patent and that said Letters Patent is hereby corrected as shown below:

ON THE TITLE PAGE:

Please remove "Jeffrey A. Karker, Cazanovia, N.Y." from the Title of the Patent in Item [54] and insert -- Jeffrey A. Karker, Cazanovia, N.Y. -- in the Inventors in Item [75].

This certificate supersedes Certificate of Correction issued September 29, 1998

Signed and Sealed this

Tenth Day of August, 1999

Attest:

Q. TODD DICKINSON

*Attesting Officer*     *Acting Commissioner of Patents and Trademarks*